United States Patent

Kanai et al.

[11] Patent Number: 6,043,988
[45] Date of Patent: *Mar. 28, 2000

[54] HARD DISK DRIVE AND HARD DISK APPARATUS HAVING BUS AND ITS INSTALLING METHOD

[75] Inventors: Hiroki Kanai, Higashiyamato; Mitsuo Ooyama, Hachioji; Yoshifumi Takamoto, Fuchu, all of Japan

[73] Assignee: Hitachi, Ltd., Tokyo, Japan

[*] Notice: This patent is subject to a terminal disclaimer.

[21] Appl. No.: 09/252,811

[22] Filed: Feb. 19, 1999

Related U.S. Application Data

[63] Continuation of application No. 08/696,801, Aug. 14, 1996.

[51] Int. Cl.[7] .................................................. H05K 1/14
[52] U.S. Cl. ..................... 361/788; 361/777; 361/778; 361/733; 361/803; 439/928.1; 439/61; 439/62; 360/97.01; 360/97.03
[58] Field of Search ...................................... 361/788, 775, 361/777, 778, 790, 796, 733, 803; 360/97.01, 97.03, 98.01; 439/928.1, 61, 62, 74, 76.1

[56] References Cited

U.S. PATENT DOCUMENTS

| | | | |
|---|---|---|---|
| 5,388,099 | 2/1995 | Poole | 370/85.12 |
| 5,579,204 | 11/1996 | Nelson et al. | 361/679 |
| 5,603,044 | 2/1997 | Annapareddy et al. | 395/800 |
| 5,640,606 | 6/1997 | Glenn, Jr. et al. | 395/882 |
| 5,652,553 | 7/1997 | Pollmeier | 333/1 |
| 5,652,697 | 7/1997 | Le | 361/788 |
| 5,696,667 | 12/1997 | Berding | 361/788 |
| 5,903,442 | 5/1999 | Kanai et al. | 361/788 |
| 8,701,006 | 5/1987 | Balogh et al. | |
| 8,707,405 | 12/1987 | Balogh et al. | |
| 9,303,798 | 4/1993 | Martinez et al. | |
| 9,322,729 | 11/1993 | Martinez et al. | |

FOREIGN PATENT DOCUMENTS

| | | |
|---|---|---|
| 0599504 | 6/1994 | European Pat. Off. . |
| 61-228519 | 10/1986 | Japan . |
| 1243284 | 9/1989 | Japan . |

Primary Examiner—Leo P. Picard
Assistant Examiner—David Foster
Attorney, Agent, or Firm—Antonelli, Terry, Stout & Kraus, LLP

[57] ABSTRACT

When a plurality of hard disks are connected by using a backplane, in order to enable a low-noise installation of the bus and a high-density installation of the hard disk to be simultaneously realized, a signal line of the bus and connectors are installed to the backplane, slots are set to installing regions of the drives, wirings of the signal lines between the connectors are set to, for example, a U-character shape, and a length of signal lines between the connectors is set to be longer than a distance between the connectors adjacent to the bus.

6 Claims, 7 Drawing Sheets

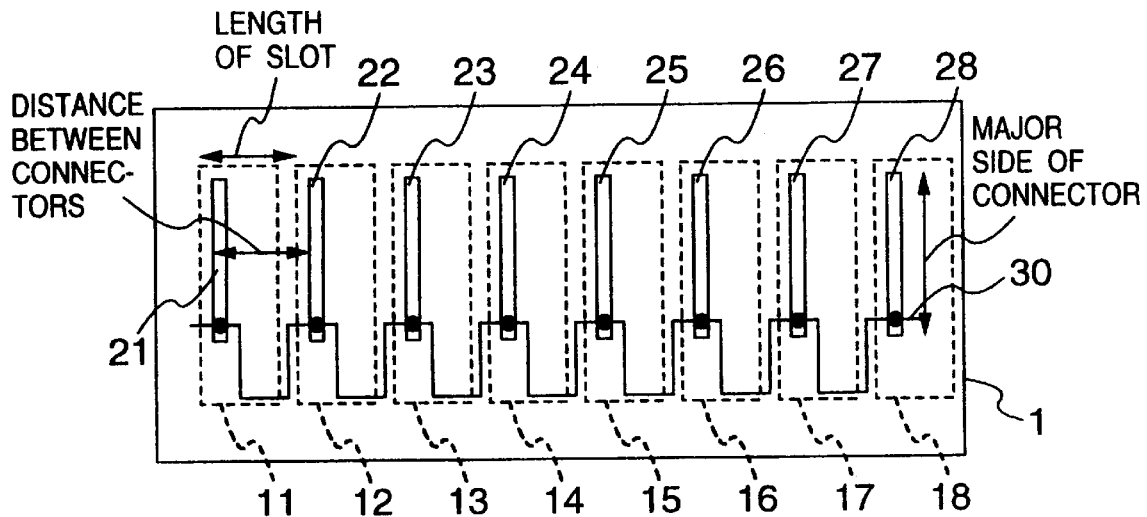
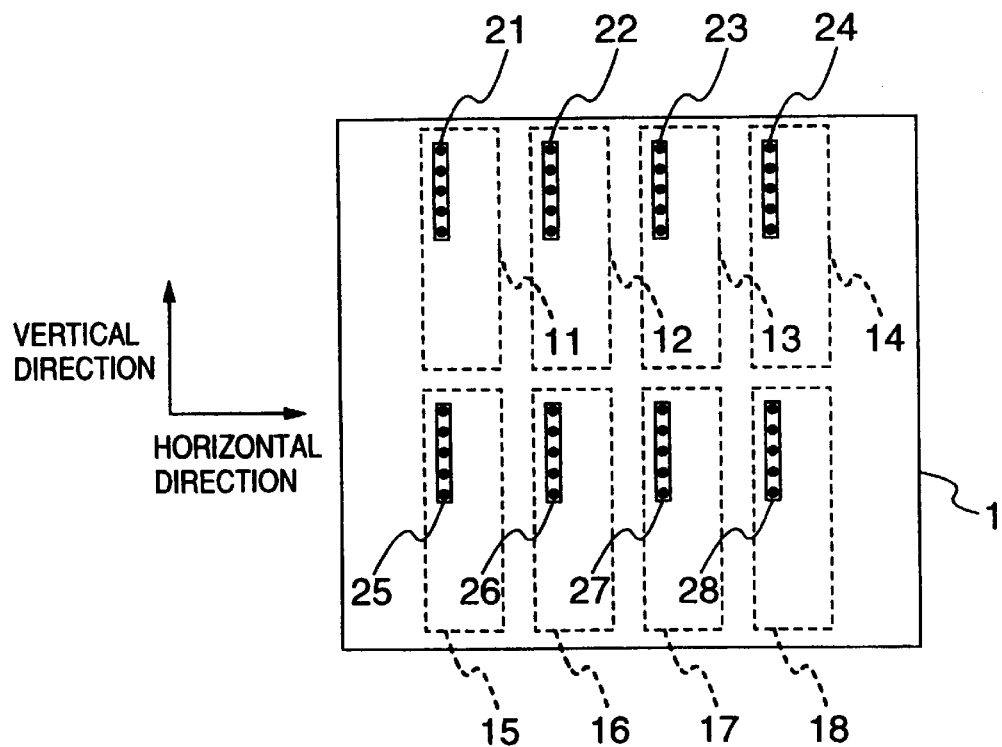

A-A CROSS SECTION

B-B CROSS SECTION

HARD DISK DRIVE AND HARD DISK APPARATUS HAVING BUS AND ITS INSTALLING METHOD

This appln is a con. of Ser. No. 08/696,801 filed Aug. 14, 1996.

BACKGROUND OF THE INVENTION

The present invention relates to a plurality of electronic equipment and its connecting method or its installing method. More particularly, the invention relates to an installing method whereby a bus which is used as an interface for connecting a plurality of hard disk drives is installed to a backplane, an apparatus installed by the method, an apparatus which is constructed by an apparatus installed by such an installing method, the hard disk drives, and the backplane and to its installing method.

A memory apparatus having a large capacity which is used by connecting to a large scale computer, a workstation of a high performance, or the like is constructed by a plurality of hard disk drives (hereinbelow, HDDs or drives). A miniaturization of the drive itself and a miniaturization of the memory apparatus are desired for the memory apparatus. It is, therefore, necessary to connect a plurality of drives at a high density in the memory apparatus of a large capacity. As a method of connecting a plurality of drives, a bus comprising a plurality of signal lines is often used. As a bus which is used as an industrial standard, for example, there is an SCSI (Small Computer System Interface) bus. According to an SCSI 2 as a standard, up to eight apparatuses can be connected to the same SCSI bus by using cables.

FIG. 10 is a perspective view showing an outline of a conventional drive. A drive 40 is connected to a cable 50 as a bus through a connector 20. In the external dimensions of the drive, a major side of the surface which is parallel with a disk 41 to record information is called a "depth", a minor side is called a "width", and a side in the stacking direction of the disks is called a "height" of drive. The connector 20 in the drive 40 is provided for a surface constructed by the width and height of "drive".

FIG. 11 is a perspective view of a conventional example of a case where a plurality of conventional drives are connected. In such a conventional example, three drives 40 are connected to the SCSI cables 50 as a bus through the connectors 20. In this case, by overlappingly installing the drives 40 in the direction of the height of the drives 40, the drives can be installed at a high density. However, there is a problem such that a handling of the cables 50 such as wiring or the like is difficult. A space for installation of the cables 50 is also needed.

To solve the problem, there is a method of installing drives to a backplane on which the bus has been installed. FIG. 12 is a conventional constructional diagram showing a construction of the backplane on which the bus has been installed. Bus signal lines 30 and connectors 21 to 24 for connecting the bus and the drives are installed on the backplane 1. The bus signal lines 30 are linearly wired among the connectors 21 to 24. Reference numerals 11 to 14 denote drive installing regions (hereinbelow, referred to as slots). In case of the conventional installing method, a plurality of connectors 21 to 24 for connecting a plurality of drives are connected to the bus signal lines 30 and connectors for the neighboring slots are adjacently installed on the bus signal lines 30. For example, in FIG. 12, the slot 12 is adjacent to the slots 11 and 13. The drive which is installed to the slot 12 is connected to the bus signal lines 30 by using the connector 22. The connector 21 for the slot 11 and connector 23 for the slot 13 are adjacently connected to the connector 22 on the bus. Therefore, a distance between the neighboring connectors (hereinbelow, referred to as an interconnector distance) is equal to a length of slot. When the drives are installed on the backplane at a high density, a length of slot is equal to a height of drive to be installed. Therefore, hitherto, the interconnector distance, the length of slot, and the height of drive to be installed are equal.

As mentioned above, when the drives are connected by using the cable, the connection distance between the neighboring connectors can be freely set by adjusting a length of cable. On the other hand, when the drives are connected at a high density by using the backplane, the distance between the neighboring connecters depends on the length of slot, namely, the height of drive to be installed.

One of the conventional examples in which the drives are installed on the backplane as mentioned above has been disclosed in, for example, JP-A-1-243284. According to such a method, a small magnetic disk unit is installed to a printed wiring board for connection through an electrical connecting portion.

One of the conventional examples in which the bus is installed to the backplane has been disclosed in, for example, JP-A-61-228519. According to such a method, a length of signal line between connectors, a distance between connectors, and a length of slot are set to be almost equal.

SUMMARY OF THE INVENTION

The purpose of the present invention is to realize a low-noise installation of buses and a high-density installation of drivers simultaneously when the drives are connected by using a backplane.

In recent years, the external dimensions of a drive are decreasing in association with the miniaturization of the drive. For example, a standard size of the height of drive as an external dimension in the stacking direction of the disks is set to 82 mm in case of a 5-inch drive, 25.4 mm in case of a 3.5-inch drive, 19 mm in case of a 2.5-inch drive, and 15 mm in case of a 1.8-inch drive. In this manner, the standard sizes are gradually shortened. Therefore, in association with the miniaturization of the drive, in order to realize an installation at a high density, a length of slot of the bus installed on the backplane and a distance between the connectors depending on the length are reduced.

When such a high-density installation is performed, however, since an impedance of a line decreases due to a load connection to the bus, there is a problem such that a reflection increases due to a mismatching of the impedance. In order to suppress the reflection, a distance between the connectors has to be increased.

However, in the conventional method of installing the drives to the backplane (JP-A-1-243284), no consideration is made with respect to a deterioration in transmission waveform when the high-density installation is performed.

In the bus installing method (JP-A-61-228519) in which the signal line length between the connectors, the distance between the connectors, and the length of slot are equalized, when the high-density installation is performed, since the length of slot is reduced as the height of drive to be installed is reduced, reflection noises increase.

When the distance between the connectors is increased, the length of slot also increases in association with it, so that the length of slot and the height of drive cannot be set to be equalized. Therefore, in the method of installing the drives by increasing the distance between the connectors, although the reflection noises are reduced, a vacant region in which no drive is installed occurs between the neighboring slots. Therefore, the high-density installation of a plurality of drives is difficult, so that the whole apparatus cannot be miniaturized in correspondence to a miniaturization of the drive. That is, according to the conventional method of installing the bus to the backplane, the low-noise installation of the bus and the high-density installation of the drives are incompatible.

It is an object of the invention to enable a low-noise installation of a bus and a high-density installation of drives to be simultaneously realized when the drives are connected by using a backplane.

According to the invention, a length of signal lines for connecting connectors which are adjacently arranged on a bus is set to be longer than a distance between the connectors to be adjacently installed on a backplane.

When the length of signal lines to connect connectors which are adjacently arranged on the bus is set to be longer than the distance between the connectors to be adjacently installed on the backplane, only a part of the signal lines of the bus can be also set to be longer.

Further, in the preferred embodiment of the invention, the distance between the connectors to be adjacently arranged on the bus is set to be longer than at least the width of connector.

Further, when the bus to be installed is an SCSI bus, it is preferable to set a length of slot to a length that is equal to or larger than 10 cm and is equal to or smaller than 30 cm.

By another means for simultaneously realizing a low-noise installation of the bus and a high-density installation of the drives, a distance between the connectors which are neighboring on the bus is set to be longer than the height of drive to be installed by connecting to the connector, and between the drives which are installed on the backplane through the connectors which are neighboring on the bus, the drives to be connected to the bus via connectors other than the connectors adjacent to the bus are installed.

In the preferred embodiment of the invention, particularly, the distance between the connectors is set to a distance that is twice or integer times as long as a height of drive.

In the preferred embodiment of the invention, particularly, drives to be adjacently installed on the backplane are installed so that the upper and lower portions are opposite.

It is also desirable to install the connector to be provided for the drive to the surface having a depth and a height of the drive and, particularly, to the inside of one surface which is divided by the center line for dividing the side in the depth direction into two portions.

Since the signal line length between the connectors which are adjacently arranged on the bus is set to be longer than the distance between the connectors which are adjacently installed on the bus, even when the height of drive to be installed is reduced, it is unnecessary to reduce the signal line length between the connectors in association with it. Thus, an increase in reflection noises can be prevented. Further, since the length of slot and the height of drive can be equalized on the backplane, the drives can be installed every height of drive. Therefore, the low-noise installation of the bus and the high-density installation of the drives can be simultaneously realized.

The distance between the connectors which are neighboring on the bus is set to be longer than the height of drive to be connected to the connector and between the drives to be installed on the backplane through the connectors which are neighboring on the bus, the drives to be connected to the bus through connectors other than the connectors adjacent to the bus are installed. Therefore, even when the height of drive to be installed is reduced, it is unnecessary to reduce the signal line length between the connectors in correspondence to it, so that an increase in reflection noises can be prevented. Further, the drives can be installed every height of drive on the backplane. Therefore, the low-noise installation of the bus and the high-density installation of the drive can be simultaneously realized.

The connector to be provided for the drive is installed to the surface constructed by the depth and height of the drive and, particularly, is installed to the inside of one surface which is divided by the center line for dividing the side in the depth direction into two portions, small drives can be easily installed at a high density.

BRIEF DESCRIPTION OF THE DRAWINGS

FIG. 1 is a constructional diagram of a backplane showing an example of a hard disk installing method according to the invention;

FIG. 2 is a constructional diagram of the backplane showing an example of the hard disk installing method according to the invention;

DESCRIPTION OF THE PREFERRED EMBODIMENTS

Figure 3A:
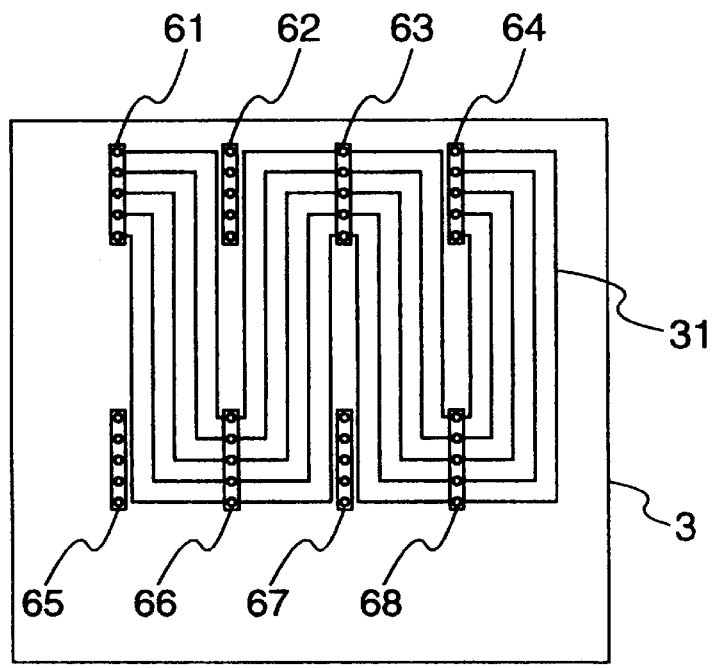
FIGS. 3A and 3B are constructional diagrams of the backplane showing an example of the hard disk installing method according to the invention.

Embodiments of the invention will now be described hereinbelow with reference to the drawings.

FIG. 1 is a constructional diagram of a backplane showing an example of a drive installing method according to the invention. The embodiment shows a case where a drive having a full-height of 3.5 inches is installed on the backplane by using a low-density type connector in which a distance between pins is equal to 2.54 mm. As shown in FIG.

1, the signal lines 30 of a bus and connectors 21 to 28 serving as connecting means of the bus and drives are installed on the backplane 1. Although the bus is constructed by a plurality of signal lines, in order to avoid a complication of the diagram, only one signal line is shown as a bus signal line 30. Slots 11 to 18 are installing regions of the drives to be connected to the bus through the connectors 21 to 28. The embodiment is characterized in that a distance between the connectors and a length of slot on the backplane 1 are equalized and the signal line length between the connectors is longer than the distance between the connectors. The connectors 21 to 28 are sequentially adjacently arranged on the bus. Therefore, the distance between the connectors and the length of slot are equal. Since the length of slot is almost equal to a height of drive to be installed, the drives can be installed at a high density. The signal lines between the connectors are wired so as to bypass in a U-shape between the connectors. Therefore, the signal line length between connectors is longer than the distance between the connectors.

In case of the disk of a full-height of 3.5 inches shown in the embodiment, its external outline dimensions are equal to about 146 mm, 102 mm, and 41 mm in accordance with the order of a depth, a width, and a height. Although a width of bus on the backplane is almost equal to a length of the longest major side of the connector, a length of longest major side of the low-density type connector which is often used in the SCSI bus and in which a distance between the pins is equal to 2.54 mm is equal to about 70 mm. Therefore, when the signal lines arranged in a U-shape is wired in the drive installing region, a signal line length of at least 100 mm can be set by adding 41 mm, that is the distance between the connectors, and 60 mm, that is the length in the vertical direction of the U-shaped wiring. Since a length in one direction is equal to about 30 mm obtained by an equation of (102 mm−70 mm) and the length of 60 mm in the vertical direction can be obtained by doubling such a length of 30 mm. When the signal line is wired so as to be widened over the drive installing region, it will be obviously understood that the signal line length can be further extended. The embodiment particularly shows a case where the signal line length between the connectors is increased with respect to only a control signal in which a data error due to a waveform deterioration by the reflection noises easily occurs. In this manner, since the signal line length between the connectors is set to be longer than the distance between the connectors, the low-noise installation of the bus and the high-density installation of the drives can be simultaneously realized. In order to set the signal line length between the connectors to be longer than the distance between the connectors, it is not limited to the construction such as to bypass in the U-shape.

Figure 3B:
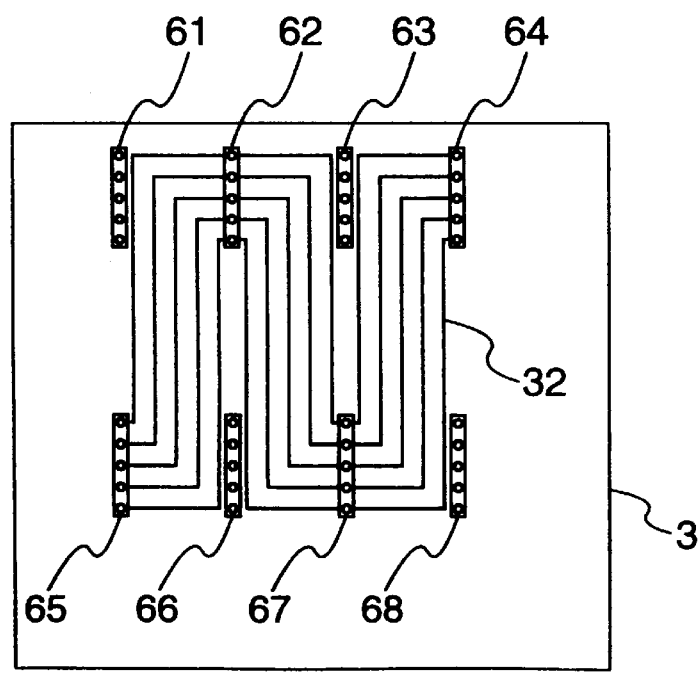

FIGS. 2, 3A, and 3B show another embodiment of the drive installing method according to the invention. FIG. 2 is a constructional diagram of the backplane. FIGS. 3A and 3B are wiring diagrams of the signal lines in first and second signal line wiring layers of the backplane shown in FIG. 2. The embodiment shows a case where a drive of 2.5 inches is installed to the backplane 1 by using a high-density type connector in which a distance between the pins is equal to 1.27 mm. In case of the 2.5-inch disk, its external dimensions are set such that a depth, a width, and a height are equal to 101 mm, 71 mm, and 19 mm, respectively. The major side of the connector is equal to or less than 50 mm. Specifically speaking, the major side of a connector of 50 pins is equal to 35 mm and that of 68 pins is equal to 46 mm. The embodiment is characterized in that a distance between the connectors to be adjacently installed in the horizontal direction on the backplane is equal to or larger than at least the maximum side length of the connector.

As shown in FIG. 2, the connectors 21 to 28 are installed to the backplane 1. The slots 11 to 18 denote the drive installing regions. Four drives are installed for each of two upper and lower stages. Further, a distance between the connectors which are neighboring in the horizontal direction on the backplane is set to the same length of 35 mm as the maximum side length of the connector.

FIGS. 3A and 3B show that the backplane 1 can be also constructed by at least two bus signal line wiring layers. FIG. 3A shows the first signal line wiring layer. Through hole arranging regions 61 to 68 correspond to the connector installing regions 21 to 28. Signal lines 31 are wired so as to connect through holes of the through hole arranging regions 61, 66, 63, 68, and 64. Specifically speaking, in order to connect the through holes of the through hole arranging regions 61 and 66, the signal lines 31 are wired between the through hole arranging regions 61 and 66 in the vertical direction. The through holes connect the connectors and signal lines. In order to wire the bus while suppressing crosstalk noises between the signal lines, a wiring width which is equal to or larger than the maximum major side length of the connector is needed. Thus, a distance between the connectors 21 and 22 is set to 35 mm of the connector width in a manner similar to FIG. 2. Therefore, the signal line length between the connectors is equal to about 106 mm by adding 71 mm of the width of drive and 35 mm of the distance between the connectors. It will be obviously understood that the signal line length can be further extended by non-linearly wiring the signal lines in the vertical direction. FIG. 3B shows the second signal line wiring layer. By the wiring method similar to that of the first signal line wiring layer shown in FIG. 3A, through holes of the through hole arranging regions 64, 67, 62, and 65 are connected. That is, in one bus signal wiring layer, the signal lines are alternately wired for the through hole arranging regions of the two upper and lower stages in a crank shape in a manner such that the signal lines are wired in an L-shape from the upper side to the lower side and are wired in an inverse L-shape from the lower side to the upper side.

As mentioned above, by setting the distance between the connectors to be equal to or longer than at least the maximum major side length of the connector, the signal line length between the connectors can be increased with respect to all of the signal lines connected to the connectors, so that the high-density installation in which the reflection noises are reduced can be performed.

Figure 4:
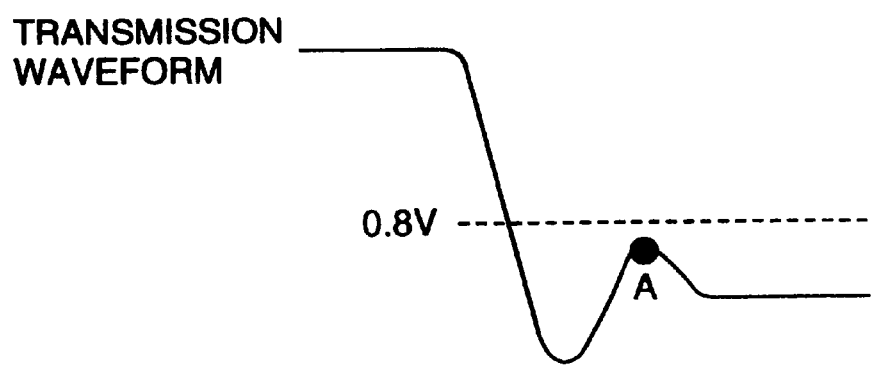
FIG. 4 is a transmission waveform diagram upon trailing according to the invention.

FIG. 4 is a transmission waveform diagram showing a transmission waveform upon trailing of the signal in the SCSI. When the signal trails, the transmission waveform deteriorates by the reflection noises and a low-level voltage rises. According to the invention, the low-level voltage is maximum at a point A in the graph. When the low-level voltage is larger than a threshold voltage at the low level, an error occurs in transmission data. According to the SCSI, a threshold voltage at the low level is equal to 0.8 V.

Figure 5:
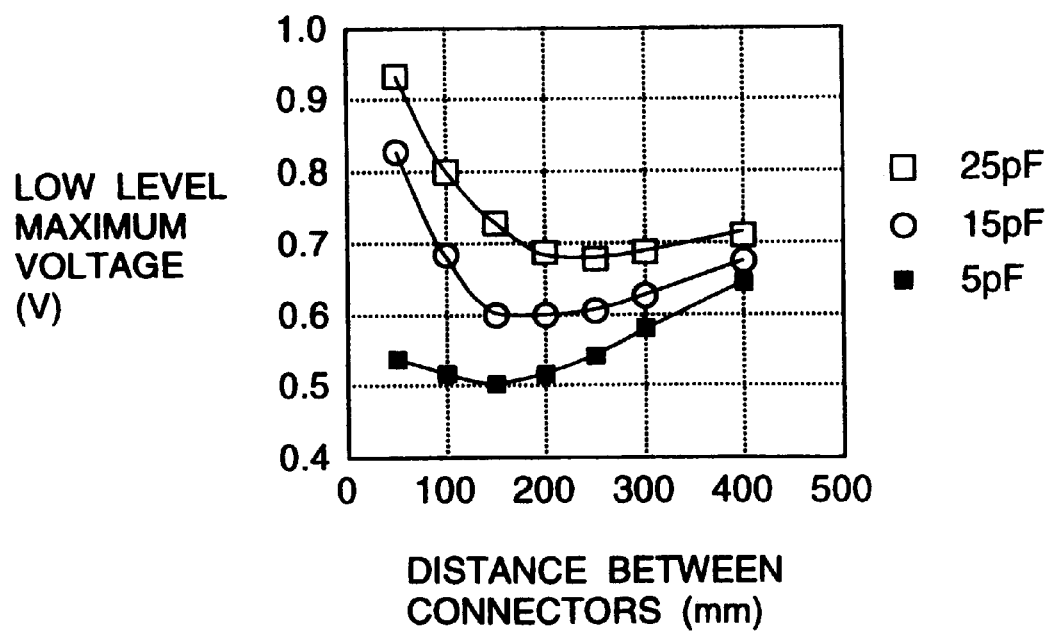
FIG. 5 is a diagram showing the relation between the distance between connectors and the maximum value of a low-level voltage according to the invention.

FIG. 5 is a diagram showing the relation between the distance between the connectors and the maximum value of the low-level voltage when the SCSI bus is installed as a bus to be installed to the backplane and eight loads of 25 pF are connected. According to the SCSI, a maximum load capacitance of the load to be connected to the bus is specified to 25 pF. As shown in FIG. 5, when the distance between the connectors is equal to or shorter than 100 mm, since the load capacitance per unit length of the load to be installed to the bus increases, a line impedance decreases and a mismatching of the impedance occurs. Therefore, the reflection noises increase and the low-level voltage is equal to or larger than 0.8 V, so that it becomes a factor of an erroneous operation. When the distance between the connectors is equal to or longer than 300 mm, as the transmission line is longer, the load capacitance of the line itself increases, so that an undershoot upon trailing also increases. Thus, the low-level voltage also increases due to the reflection. Therefore, it is desired to set the distance between the connectors to a length which is equal to or larger than 100 mm and is equal to or less than 300 mm.

Figure 6:
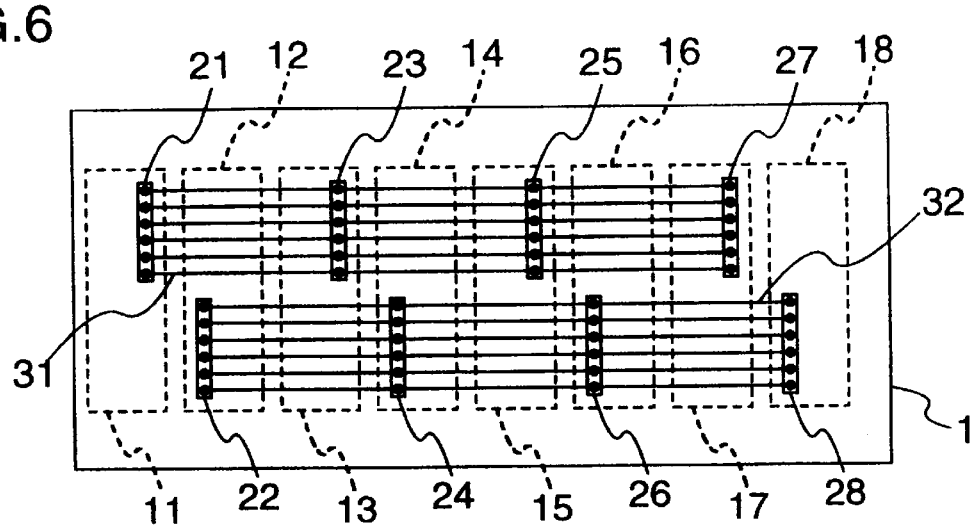
FIG. 6 is a constructional diagram of a backplane showing an example of the hard disk installing method according to the invention.

FIG. 6 is a constructional diagram of a backplane showing another embodiment of the bus installing method according to the invention. The embodiment shows a case where a drive of a full-height of 3.5 inches is installed to the backplane by using a high-density type connector in which a distance between the pins is equal to 1.27 mm. As shown in FIG. 6, buses of two different systems have been installed to the backplane 1 and signal lines 31 and 32 of the buses and the connectors 21 to 28 serving as connecting means of the buses and drives have been installed. The slots 11 to 18 are the installing regions of the drives to be connected to the buses through the connectors 21 to 28. The connectors 21, 23, 25, and 27 are connected to a first bus constructed by the signal lines 31. The connectors 22, 24, 26, and 28 are connected to a second bus constructed by the signal lines 32. That is, four drives are connected to each bus. The maximum side length of the high-density type connector is equal to or shorter than 50 mm. In case of a connector having 50 pins, the maximum side length is equal to 35 mm and, in case of a connector having 68 pins, it is equal to 46 mm. The embodiment is characterized in that a distance between the connectors which are neighboring on the bus is longer than a height of the drive to be connected to the connector and installed and between the drives to be installed on the backplane through the connectors which are neighboring to the bus, the drive to be connected to the bus is installed through the connector other than the connectors adjacent to the bus. A length of signal lines between the connectors which are neighboring on the same bus is twice as long as the length of slot.

Specifically speaking, for example, the slot 22 which is connected to the second bus constructed by the signal lines 32 and is an installing region of the drives to be installed is provided between the slots 21 and 23 as installing regions of the drives to be connected to the first bus constructed by the signal lines 31. The distance between the connectors and the length of signal lines between the connectors are equal. Since the height of drive is equal to 41 mm, a length of slot is set to 50 mm in consideration of an installing gap between the drives. Therefore, a signal line length between the connectors 21 and 23 which is twice as long as the length of slot is equal to 100 mm. Consequently, a high-density installation in which reflection noises are reduced is realized.

Figure 7:
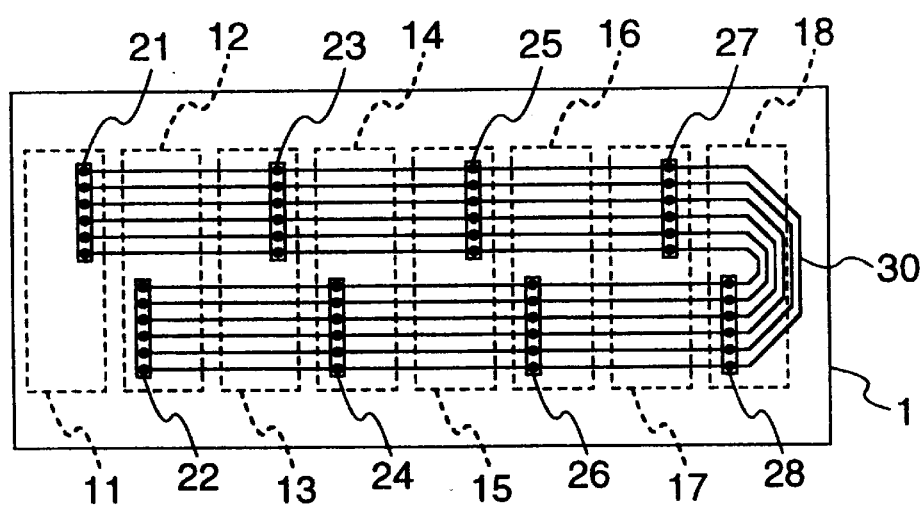
FIG. 7 is a constructional diagram of the backplane showing an example of the hard disk installing method according to the invention.

FIG. 7 is a constructional diagram of a backplane showing another embodiment of the bus installing method according to the invention. The embodiment shows a case where a drive of a full-height of 3.5 inches is installed to the backplane by using a high-density type connector in which a distance between the pins is equal to 1.27 mm. The embodiment is characterized in that between slots for drives to be connected and installed to the connectors which are adjacently connected on the bus, a slot for drives to be connected and installed to the other connector of the same bus is provided. The backplane 1 is constructed by the bus signal lines 30 and connectors 21 to 28. The bus signal lines 30 are wired in a ⊐-shape from the left upper side to the left lower side on the backplane 1. The slots 11 to 18 are sequentially adjacently arranged in the direction from the left to the right on the backplane 1. On the contrary, the connectors 21 to 28 provided for the adjacent slots 11 to 18 are not sequentially neighboring on the bus. Between the slots using the neighboring connectors, the slot using the other connector is arranged. For example, although the slots 11 and 12, and the slots 12 and 13 are adjacent, respectively, the connector 21 for the slot 11 and the connector 22 for the slot 12 are not adjacent. The connectors 22 and 23 are also not adjacent but the connectors 21 and 23 are adjacent on the bus. Therefore, even when a number of drives are connected to the same bus, the reflection noises are reduced and the drives can be installed at a high density.

Figure 8:
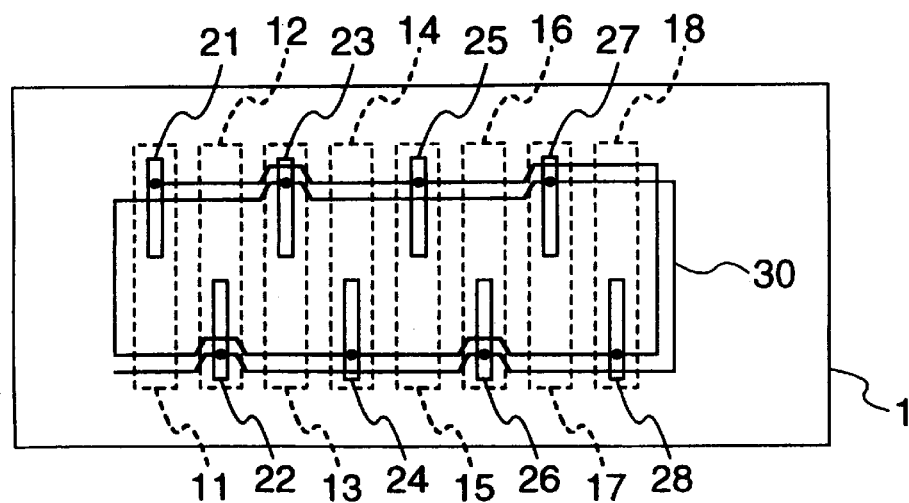
FIG. 8 is a constructional diagram of the backplane showing an example of the hard disk installing method according to the invention.

FIG. 8 shows a constructional diagram of a backplane showing another embodiment of the bus installing method according to the invention. The embodiment shows a case where a drive of 3.5 inches and a thickness of 1 inch is installed by using a high-density type connector in which a distance between the pins is equal to 1.27 mm. External dimensions of the 3.5-inch drive having the 1-inch thickness are set to about 146 mm, 102 mm, and 25.4 mm in accordance with the order of a depth, a width, and a height. The embodiment is characterized in that a plurality of slots are provided between the drives to be connected and installed to the connectors adjacently connected on the bus. A distance between the neighboring connectors on the bus and a length of signal lines between the connectors are equal. Specifically speaking, the connectors 21, 25, 28, 24, 23, 27, 26, and 22 are sequentially adjacently connected on the bus. Therefore, the connectors 21 and 25 are adjacently connected on the bus. The slots 12, 13, and 14 for three drives to be connected to the bus through the connectors 22, 23, and 24 are provided between the slot 11 for the drive to be connected to the bus through the connector 21 and the slot 15 for the drive to be connected to the bus through the connector 25. Consequently, a length of signal line between the connectors 21 and 25 is equal to or longer than at least 101.6 mm obtained by adding the heights of four drives. Thus, a high-density installation in which the reflection noises are reduced can be realized. In order to prevent crosstalk noises which occurs due to a decrease in distance between the parallel signal lines in association with an increase in number of wires among pins, the signal lines of the bus can be also divided into a plurality of layers and wired.

Figure 9A:
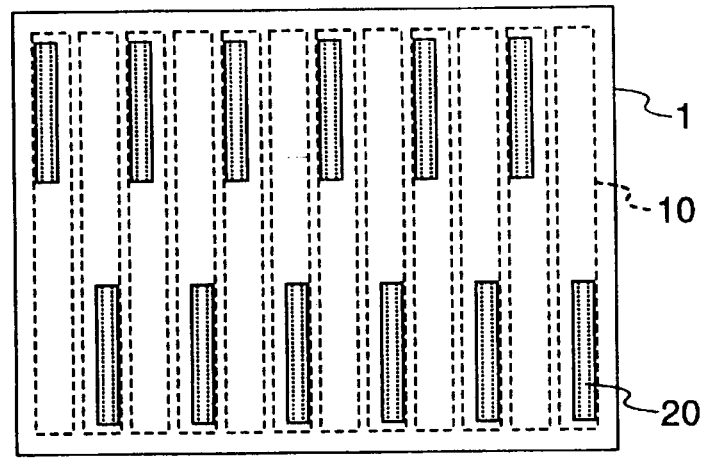
FIGS. 9A, 9B, 9C, and 9D are constructional diagram showing an example of the hard disk installing method according to the invention.
Figure 9B:
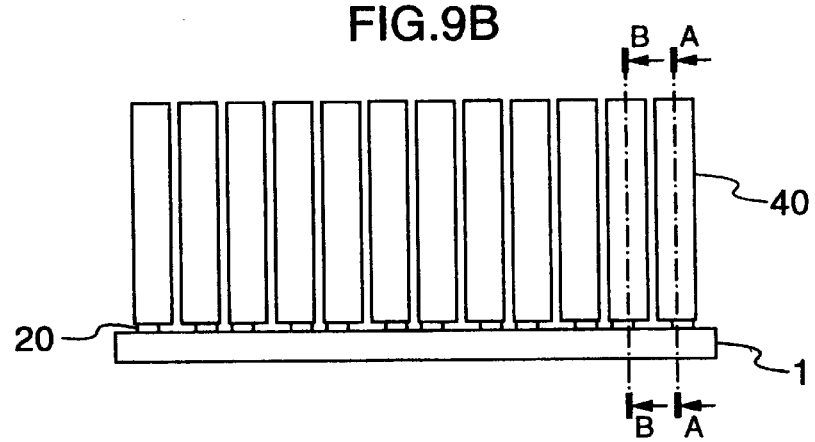
Figure 9C:
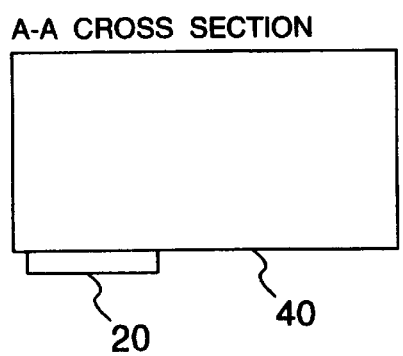
Figure 9D:
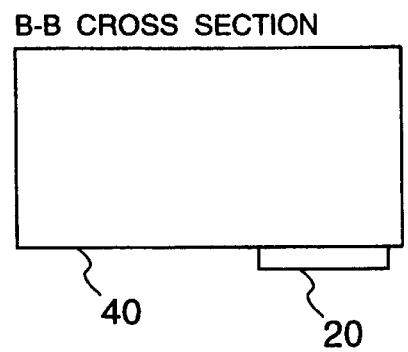
Figure 10:
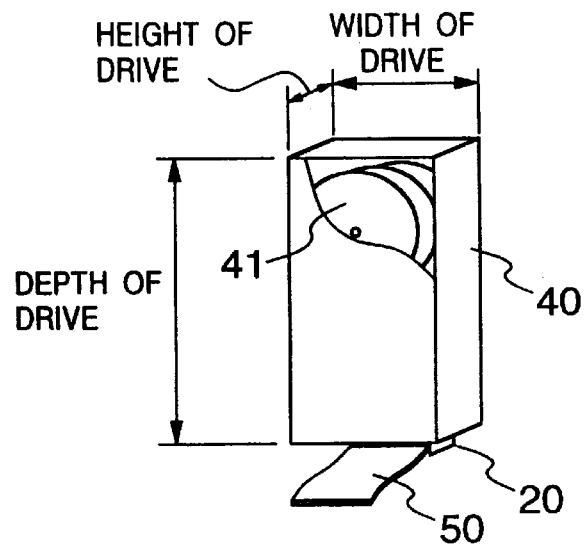
FIG. 10 is a diagram showing a constructional example of a conventional hard disk.
Figure 11:
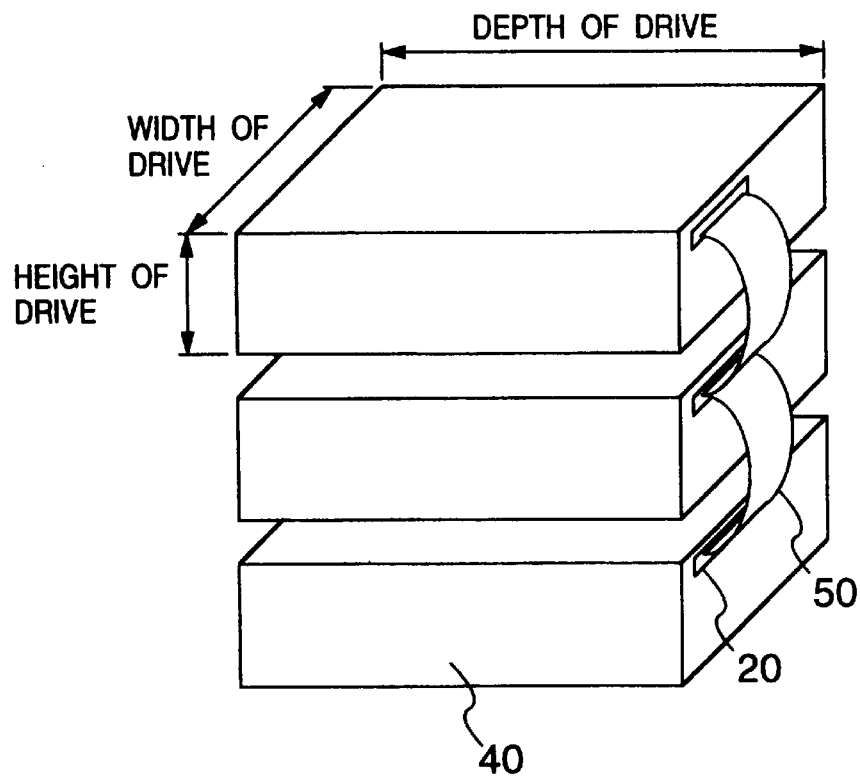
FIG. 11 is a perspective view of a conventional example of a conventional case where a plurality of drives are connected.
Figure 12:
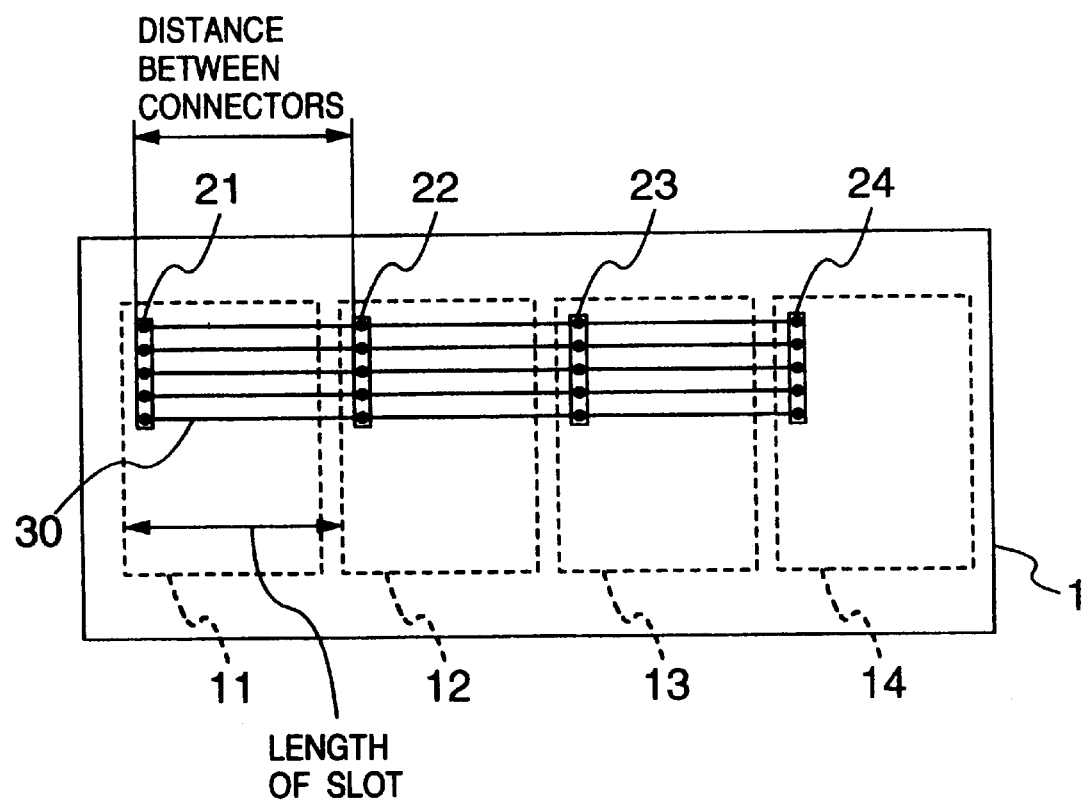
FIG. 12 is a constructional diagram of a backplane showing an example of a conventional bus installing method.

FIGS. 9A, 9B, 9C, and 9D are constructional diagrams showing another embodiment of the drive installing method according to the invention. The embodiment shows a case where a 3.5-inch drive having a 1-inch thickness is installed to the backplane by using a low-density type connector in which a distance between the pins is equal to 2.54 mm. FIGS. 9A to 9D are constructional diagrams of the drives and backplane according to the embodiment. FIG. 9A is a plan view showing an arrangement of the backplane 1 and connectors 20 which are installed thereto. A slot 10 is a drive installing region. The connectors 20 are installed to the adjacent slots 10 in a manner such that upper and lower portions are opposite. FIG. 9B is a side elevational view when the same kind of drives 40 are installed to the backplane in FIG. 9A. The same kind of drives 40 to be installed to the neighboring slots are installed so that the upper and lower portions are opposite. FIGS. 9C and 9D are cross sectional views of the drive 40 in FIG. 9B taken along the line A—A and the line B—B, respectively. The connector 20 is provided for the surface constructed by a depth and a height of the drive 40. In this instance, the connector 20 is provided for the surface within the half of the side in the depth direction of the drive 40. Consequently, the same kind of drives 40 can be installed to the backplane 1 shown in FIG. 9A. Particularly, the embodiment is effective when the length of maximum side of the connector to be installed to the drive is longer than the half of the width of the drive.

Although the above embodiments show the cases using the SCSI as a bus for installing the small drives as electronic equipment to be installed to the bus onto the backplane, the electronic equipment to be installed and the bus are not limited. For example, the invention is also effective when a plurality of packages in which the electronic equipment have been installed are connected by using a system bus such as VME or the like is used as a bus. The invention can be also applied to a case where a plurality of drives are connected by using a serial bus using a light as signal transmitting means.

As mentioned above, according to the invention, since the signal line length between the connectors which are adjacently arranged on the bus is set to be longer than the distance between the connectors which are adjacently installed on the bus, there is an effect such that the reflection noises can be reduced. Further, since the distance between the connectors and the length of slot for installing the drive are equal to the height of drive, there is an effect such that the drives can be installed at a high density. Therefore, there is an effect such that the reduction of reflection noises and the high-density installation of drives can be simultaneously realized.

When the length of signal line connecting the connectors which are arranged on the bus so as to be neighboring each other is set to be longer than the distance between the connectors which are installed on the backplane so as to be neighboring, only a partial signal line of the bus is set to be longer than such a distance. There is, consequently, an effect such that the reflection noises can be reduced without increasing the signal line wiring region.

Further, according to a desired form of the invention, since the distance between the connectors which are arranged on the bus so as to be neighboring each other is set to a value which is equal to or longer than at least the width of connector, there is an effect such that all of the signal lines connected to the connector can be non-linearly arranged on the same wiring layer. There is also an effect such that there is no need to reduce the distance between the parallel signal lines.

Further, when the bus to be installed is the SCSI bus, since the length of slot is set to a value which is equal to or longer than 10 cm and is equal to or shorter than 30 cm, there is an effect such that the hard disks which are connected by using the SCSI bus can be efficiently installed at a high density. By setting the slot length to a value which is equal to or shorter than 30 cm, the wiring region on the backplane can be reduced, so that there is also an effect such that the wirings can be easily performed.

The distance between the connectors which are neighboring on the bus is set to be longer than the height of drives which are connected to the connector. Between the drives which are installed on the backplane through the connectors which are neighboring on the bus, the drives to be connected to the bus are installed through the connectors other than the connectors which are adjacent to the bus. Therefore, as for the length of the signal lines between the connectors, even when the height of drives to be installed becomes short, there is no need to reduce the length of the signal lines between the connectors in accordance with such a height reduction. There is an effect such that an increase in reflection noises can be prevented. Further, on the backplane, the drives can be installed every height of the drive and there is an effect such that the drives can be installed at a high density.

According to a desirable form of the invention, particularly, since the distance between the connectors has been set to a value that is two times or integer times as long as the height of the drives, there is an effect such that the hard disks can be efficiently installed at a high density.

Further, since the drives to be installed on the backplane so as to be neighboring are installed so that the upper and lower portions are opposite to each other, all of the signal lines can be wired in the same wiring layer and there is an effect such that it is unnecessary to reduce the distance between the parallel signal lines. There is also an effect such that there is no need to provide a plurality of wiring layers.

According to another desirable form of the invention, the connectors to be provided for the drives are installed to the surface with the depth and height of the drives. Particularly, the connectors are installed on the inside of one surface which is divided by the center line for dividing the side in the depth direction into two portions. There is, consequently, an effect such that the small drives can be easily installed at a high density.

What is claimed is:

1. A storage apparatus comprising:
   a backplane;
   a first signal line mounted on said backplane;
   a second signal line mounted on said backplane;
   a first disk drive mounted on said backplane;
   a second disk drive mounted on said backplane next to said first disk drive;
   a third disk drive mounted on said backplane next to said second disk drive;
   a fourth disk drive mounted on said backplane next to said third disk drive;
   wherein said first disk drive and said third disk drive are electrically connected to said first signal line, but not electrically connected to said second signal line,
   and said second disk drive and said fourth disk drive are electrically connected to said second signal line, but not electrically connected to said first signal line.

2. A storage apparatus according to claim 1, wherein said first disk drive, said second disk drive, said third disk drive and said fourth disk drive are hard disk drives.

3. A storage apparatus according to claim 1, wherein said first signal line and said second signal line are SCSI buses.

4. A storage apparatus according to claim 1, wherein said first signal line and said second signal line are electrically connected.

5. A storage apparatus according to claim 4, wherein said first disk drive, said second disk drive, said third disk drive and said fourth disk drive are hard disk drives.

6. A storage apparatus according to claim 4, wherein said first signal line and said second signal line are SCSI buses.

* * * * *